US010700687B1

(12) United States Patent
Attineni et al.

(10) Patent No.: US 10,700,687 B1
(45) Date of Patent: Jun. 30, 2020

(54) SYSTEMS AND METHODS FOR DYNAMIC PHASE ALIGNMENT OF CLOCKS

(71) Applicant: Intel Corporation, Santa Clara, CA (US)

(72) Inventors: Ravindar Attineni, Singapore (SG); Sachin Mathur, Bangalore (IN); Jiaxiang Shi, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/233,554

(22) Filed: Dec. 27, 2018

(51) Int. Cl.
*H03L 7/06* (2006.01)
*H03L 7/087* (2006.01)
*H03L 7/093* (2006.01)
*H03L 7/081* (2006.01)
*G01R 31/319* (2006.01)
*G06F 1/12* (2006.01)

(52) U.S. Cl.
CPC ........ *H03L 7/081* (2013.01); *G01R 31/31922* (2013.01); *G06F 1/12* (2013.01)

(58) Field of Classification Search
CPC ...... H03L 7/081; G01R 31/31922; G06F 1/12
See application file for complete search history.

(56) References Cited

U.S. PATENT DOCUMENTS

| 6,791,995 | B1 | 9/2004 | Azenkot et al. |
| 7,315,967 | B2 | 1/2008 | Azenko et al. |
| 9,705,512 | B1 * | 7/2017 | Kuan ................... H03L 7/0891 |
| 9,722,617 | B2 * | 8/2017 | Zhang ................... H03L 7/093 |

* cited by examiner

*Primary Examiner* — Kenneth B Wells
(74) *Attorney, Agent, or Firm* — 2SPL Patent Attorneys

(57) ABSTRACT

A phase alignment system for aligning clocks is disclosed. The system includes a calibration circuit and a phase locked loop (PLL). The calibration circuit is configured to receive a variable clock and a reference clock; determine phase alignment based on metastability; determine phase misalignment and generate a phase shift upon determining phase misalignment. The PLL is configured to generate the variable clock and incorporate the phase shift.

12 Claims, 6 Drawing Sheets

SYSTEMS AND METHODS FOR DYNAMIC PHASE ALIGNMENT OF CLOCKS

FIELD

Various embodiments generally relate to clock generation and clock alignment.

BACKGROUND

Communication systems and the like use a variety of clocks and frequencies to modulate information, transmit information, decode information and the like. The operation and alignment of clocks can be required for proper operation.

For example, in processor based systems, a partition of the system works on a fixed frequency while another partition of the system operates using dynamic frequency scaling, also referred to as a variable clock, based on operation/performance of the system.

Due to high frequency scaling between the variable clock and the fixed clock, these clocks are generally not able to be generated from a single phase locked loop (PLL). As a result, the variable clock and the fixed clock are typically generated from separate PLLs.

What is needed are techniques to dynamically align clocks for communication systems and/or processor based systems.

DETAILED DESCRIPTION

Figure 1:
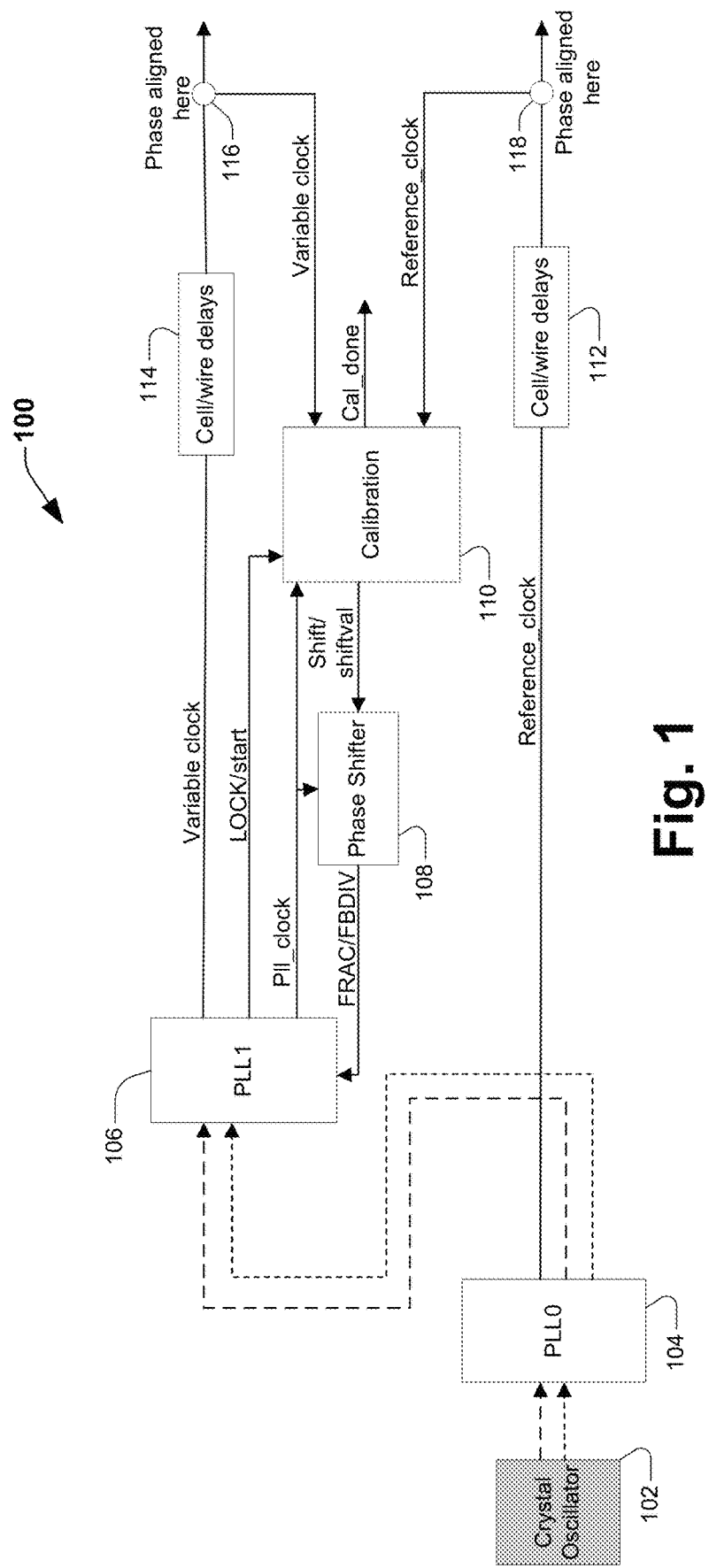
FIG. 1 is a diagram illustrating an architecture for synchronizing multiple clocks in accordance with some embodiments.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1, RAN2, 5G and the like.

Synchronous clocks are commonly used in communication systems and the like, such as those utilizing or involving cable modems (CMs). A first portion of a system may operate at one clock frequency while other portions operate at different clock frequencies. CMs are generally used to connect or bridge a local network with a larger network, such as the Internet. The CM is a network bridge that can provide communication over a medium, such as hybrid fibre-coaxial (HFC) and radio frequency over glass (RFoG), coaxial cable and the like.

A CM typically includes an analog front end (AFE) and a silicon on chip (SoC). The CM can be compatible with or support a cable modem standard, such as device over cable service interface specification (DOCSIS) and various versions such as 3.0, 3.1, 3.1 Full Duplex and the like.

The SoC can include at least one hardware module or circuit that requires two or more clocks to be phase aligned. The two or more clocks have clock frequencies that are dynamically changed. The two or more clocks can be synchronous and/or ratio synchronous. However, the two or more clocks and can be subject to process voltage temperature (PVT) variations, generation differences, path delays and the like that result in phase mis-alignment of the two or more clocks.

Other approaches to synchronize clocks can include use of dividers. However, the use of dividers requires divider adjustment for any change in frequency. The use of dividers also increases circuit complexity and limits the size of the frequency step based on using a feasible number of dividers.

One or more embodiments are disclosed that facilitate clock synchronization without requiring dividers. The embodiments include clock generation/regeneration from one clock to two or more synchronous clocks as outputs. The embodiments can utilize a comparison of clocks using a comparator flop. When the clocks are aligned, the comparator flop enters a metastability state. A detection circuit detects the metastability state and identifies that the clocks are in phase. If the clocks are not synchronized, phase shifts are determined and the applied until the clocks become in phase.

FIG. 1 is a diagram illustrating an architecture 100 for synchronizing multiple clocks in accordance with some embodiments. The architecture 100 can be implemented as an apparatus or system and is provided for illustrative purposes. It is appreciated that additional elements can be included in the architecture, one or more of the included elements can be omitted and one or more the elements can be replaced by a suitable element.

The architecture 100 includes a crystal oscillator 102, a first phase locked loop (PLL) 104, a second PLL 106, a phase shifter 108, a calibration circuit 110, first cell/wire delays 112 and second cell/wire delays 114.

The oscillator 102 generates one or more oscillator signals, which are provided to the first PLL 104. The first PLL 104 generates a reference clock and one or more first PLL clock signals.

The second PLL 106 generates a plurality of signals based on the one or more first PLL clock signals. The generated plurality of signals includes a variable clock and a PLL clock (PLL_clock). The variable clock can have its frequency dynamically changed and generated.

The variable clock is subject to delays and the like that impact the timing of the clock. The delays and the like are included and/or represented by the second cell/wire delays 114.

The delays can include and/or be based on cell delays. Additionally, the variable clock generated from the second PLL 106 has a phase offset with the reference clock from the PLL 104. This phase offset is due to the clocks being generated by different PLLs and can be a significant or major phase offset contributor to the overall phase offset between the variable clock and the reference clock.

The reference clock of the first PLL 104 is also subject to delays and the like that impact the timing of the clock. The delays and the like for the reference clock and included and/or represented by the first cell/wire delays 112.

The delayed/output variable clock is provided at a variable output 116 and the delayed/output reference clock is provided at a reference output 118.

The output variable clock is phase aligned with the output reference clock. The output variable clock can have a varied frequency, such as 16 times the frequency of the output reference clock. The variable clock has a frequency that can change dynamically.

The calibration circuit 110 is configured to monitor phase alignment and phase align the variable clock and the reference clock. The calibration circuit 110 generates a phase shift value based on the reference clock and the variable clock. The phase shift value is zero or not generated when the reference clock and the variable clock are phase aligned. The calibration circuit 110 initiates calibration or phase alignment in response to a lock/start signal, shown from the second PLL 106 in one example. In one example, the phase shift value is a fixed phase shift and results in a variable clock phase shift of 15 pico seconds (ps).

The phase shifter 108 updates a fractional/integer value (FRAC) with the phase shift value from the calibration circuit 110 using the PLL clock generated by the second PLL 106.

The second PLL 106 adjusts its phase based on the fractional value. After the change, the calibration circuit 110 is configured to again monitor the phase alignment of the variable clock and the reference clock. The calibration circuit 110 can generate updated or additional phase shift values until the variable clock and the reference clock are determined to be in phase.

In one example, the calibration circuit 110 uses or includes a comparison flip flop. The calibration circuit 110 samples the variable clock and the reference clock for a number of cycles or samples of the reference clock. The calibration circuit 110 compares the samples to generate a plurality of comparison values for the number of cycles. The comparison values can be analyzed to determine whether the clocks are phase aligned or phase mis-aligned. If they are phase mis-aligned, the calibration circuit 110 determines a direction and phase shift based on the comparison values.

The flop receives the variable clock and the reference clock at its inputs. If the clocks are phase aligned, the flop or flops enter a metastability state. Otherwise, the flop indicates the presence of phase misalignment and a comparison value is generated.

The calibration circuit 110 generates a calibration complete signal (Cal_done) to signal that the variable clock and the reference clock are phase aligned when the calibration circuit 110 determines that the clocks are phase aligned.

It is appreciated that suitable variations of the architecture 100 are contemplated.

Figure 2:
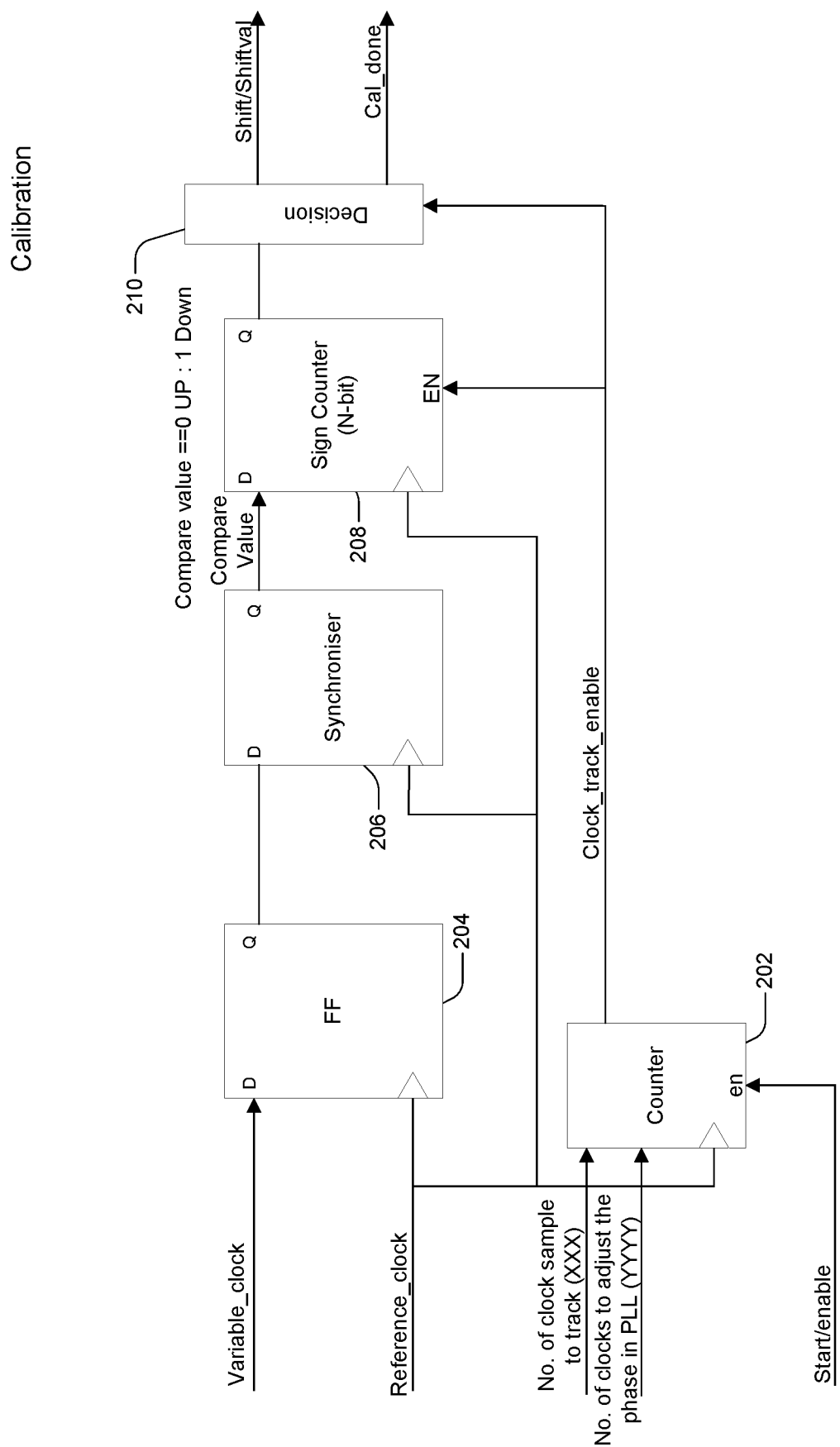
FIG. 2 is a diagram illustrating a calibration circuit in accordance with one or more embodiments.

FIG. 2 is a diagram illustrating a calibration circuit 110 in accordance with one or more embodiments. The calibration circuit 110 is provided for illustrative purposes and it is appreciated that suitable variations are contemplated.

The calibration circuit 110 can be understood with reference to the arrangement 100, described above.

The calibration circuit 110 is an example of a suitable calibration circuit that can be used with or in the arrangement 100, described above. However, it is appreciated that variations of the calibration circuit 110 shown in FIG. 2 can be used with the arrangement 100 of FIG. 1.

The calibration circuit 110 includes a flip flop 204, a synchronizer 206, a sign counter 208, a decision circuit 210 and a counter 202.

The counter 202 receives and/or is clocked by a reference clock as shown. The counter 202 also receives a plurality of inputs that can include a number of clock samples to track, a number of clocks to adjust the phase in the second PLL 106. Additionally, the counter 202 receives a start/enable signal at its enable input. The start/enable signal enables counting by the counter 202. The counter generates a clock enable signal (Clock_track_enable) based on its inputs. The clock enable signal is provided to the sign counter 208 and the decision circuit 210.

The counter 202 essentially enables operation of the sign counter 208 and the decision circuit 210 for a number of cycles until the number of cycles to track have been reached. In one example, the number of cycles to track is 64 and the counter 202 provides or enables the clock enable signal for 64 cycles.

The flop 204 in this example is a D type flip flop. The flop 204 receives a variable clock at its input (D) and the reference clock at its clock input. The flop output (Q) is provided to the synchronizer 206.

The synchronizer 206 receives the output of flop 204 at its input and is also clocked by the reference clock. The synchronizer in this example is also a D type flip flop.

The synchronizer 206 generates a compare value at its output (Q).

The flop 204 has a state based on its input (D) and its clock. Generally, the flop 204 outputs a '1' for an input of '1' and a '0' for an input of '0', which are referred to as stable states. The flop 204 has an interderminate state, where its output is neither a '1' or '0'. The flop 204 output can oscillate back and forth in what is referred to as a metastable state. This property is referred to as metastability.

It is appreciated that if the variable clock and the reference clock are out of phase or not phase aligned, the flop 204 enters one of the stable states and provides a stable output. However, if the variable clock and the reference clock are phase aligned, the flop 204 enters the metastable state. The synchronizer 206, which is also clocked by the reference clock, generates a compare value when the flop 204 is in the metastable state. The compare value indicates a direction and is counted by the sign counter 208.

In one example, a compare value of 0 indicates an up direction and a compare value of 1 indicates a down direction.

The decision circuit 210 determines or generates a shift/shift value, which can be used by the phase shifter 108. The decision circuit 210 can also determine that calibration is done (Cal_done) or completed and generates a signal (Cal_done). The calibration can be deemed complete when the phases are aligned. If the phases are not aligned, the calibration circuit generates a phase shift/shift value after tracking the clocks for XXXX number of cycles or clock samples.

The generated shift value is or can used by the phase shifter 108 to align or more closely align the variable clock and the reference clock.

It is appreciated that suitable variations of the calibration circuit 110 are contemplated. The circuit 110 is shown with elements and an arrangement for illustrative purposes, however additional elements or circuits can be added and/or used instead of the shown elements.

Figure 3:
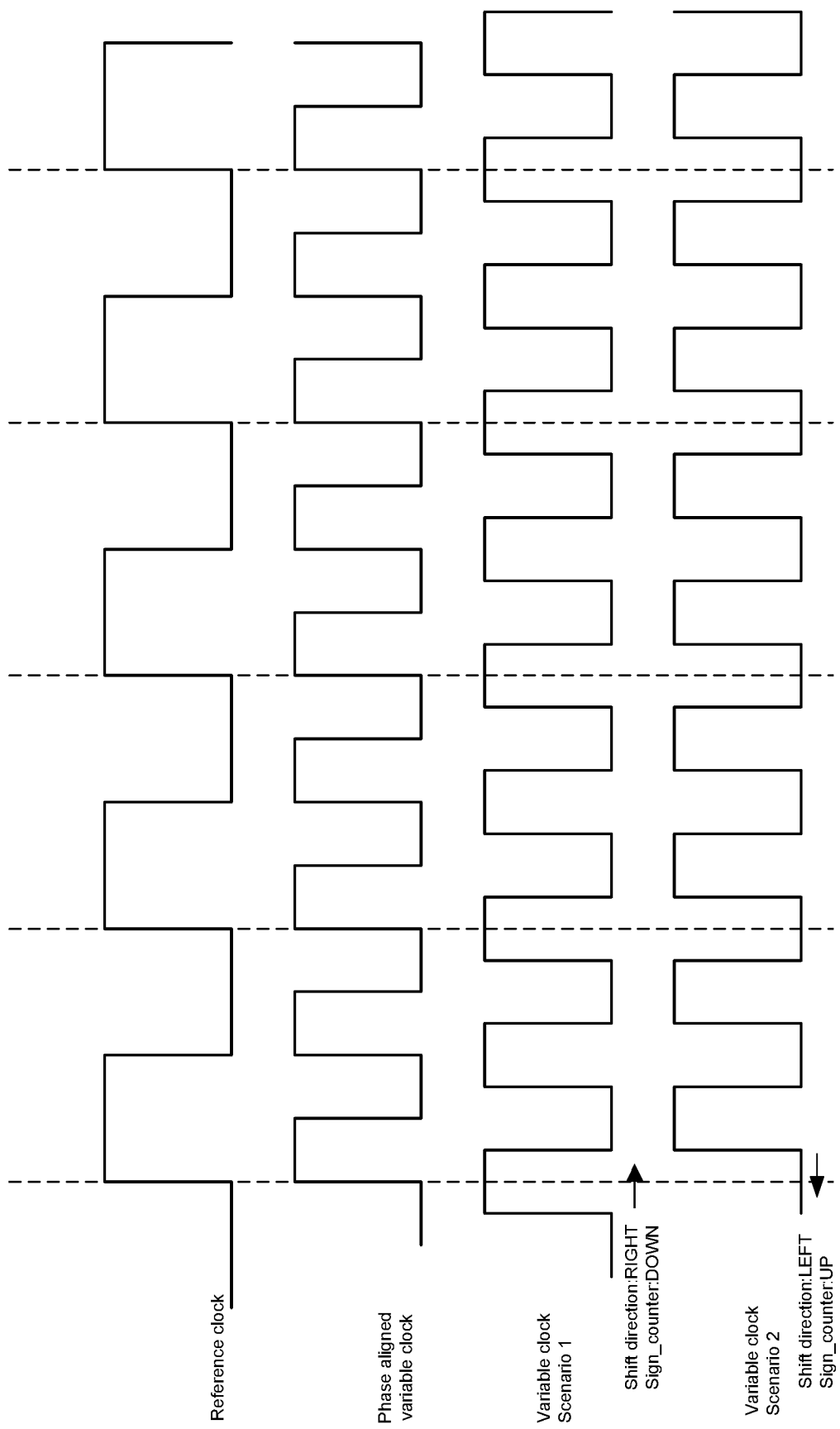
FIG. 3 is a timing diagram for clock signals associated with an architecture for clock alignment in accordance with one or more embodiments.

FIG. 3 is a timing diagram for clock signals 300 associated with an architecture for clock alignment in accordance with one or more embodiments. The clock signals 300 are provided for illustrative purposes and it is appreciated that suitable variations are contemplated. The clock signals 300 can be used with and/or generated by the architecture 100, described above.

The signals 300 are depicted with an x-axis showing time and a y-axis showing signal amplitude. The signals 300 include a reference clock as an uppermost signal. Vertical dashed lines indicate a single time period or clock cycle of the reference clock.

The reference clock can be generated by the first PLL 104 and can be provided at the reference output 116. Various example variable clocks are shown below the reference clock. The variable clock has a frequency that is a multiple of the reference clock. In one example, the variable clock has twice the frequency of the reference clock.

A calibration circuit, such as the calibration circuit 110, compares the phases of the reference clock and the variable clock for a selected number of cycles of the reference signal, such as 64 cycles. The reference clock and the variable clock are determined to be phase aligned or mis-aligned based on the comparisons over the selected number of cycles.

A first example depicts a phase aligned variable clock shown below the reference clock. The variable clock has matching phases or phase alignment with the reference clock as shown by the rising edges of the variable clock matching rising edges of the reference clock. Thus, the calibration circuit generates comparisons for the selected number of cycles. The comparisons of the clocks using a flip flop result in the flop entering a metastable state, as described above. As a result, the comparisons show that the variable clock and the reference clock are phase aligned and the calibration circuit determines that the clocks are phase aligned.

Another example, referred to as scenario 1 is shown in FIG. 3 below the phase aligned variable clock and depicts an early variable clock. This variable clock is also a multiple of the reference clock, but the phase is early. In this example, the calibration unit again generates comparisons for the selected number of cycles. A sign counter is modified based on the generated comparisons. The sign counter 208 indicates the shift direction as right and the sign counter as down. The decision circuit 210 determines a shift value. The shift value can be a fixed value, predetermined value, and the like.

Yet another example, referred to as scenario 2 is shown in FIG. 3 below the early variable clock and depicts a late variable clock. The late variable clock is again a multiple of the reference clock, but the phase is late. In this example, the calibration unit again generates comparisons for the selected number of cycles. The sign counter 208 is modified based on the generated comparisons. The sign counter 208 indicates the shift direction as left and the sign counter as up, as an example. The decision circuit 210 determines a shift value for the late variable clock.

It is appreciated that the variable clocks can be at other frequencies and have other phase variances.

Generally, the calibration circuit 110 compares the variable clock with the reference clock on every rising edge of the reference clock. In one example, the variable clock and the reference clock are sampled. The clocks can be compared using the compare flop 204 to determine which direction should the phase of variable clock be shifted. The compare flop 204 can compare the sample of the variable clock and the sample of the reference clock, generally at the rising edge of the reference clock in one example.

If the variable clock is on the left of the reference clock edge, the compare flop 204 samples a value of "1". This sampled "1" will down count the sign counter.

If the variable clock is on the right of the reference clock edge, the compare flop samples a value of "0", resulting in up counting of the sign counter.

The comparison is carried for a pre-determined or selected number of clock samples (XXXX) before making a decision on shift/shift value or phase alignment detection. In one example, the selected number of reference clock cycles XXXX is equal to 64.

At the end of the clock samples (XXXX), the calibration circuit 110 generates a fixed shift value with the sign of the shift value following sign counter. The shift value does not need to be generated If the sign counter is positive, a PLL fractional/integer value will be added with the fixed shift value for one PLL reference clock, causing the second PLL 106 to left shift the variable clock.

If the sign counter is negative, the PLL fractional/integer value will be subtracted with the fixed shift value for one PLL reference clock, causing the second PLL 106 to right shift the variable clock.

If the sign counter is less than a threshold value, it is determined that the variable clock and the reference clock are phase aligned. In one example, the threshold value is based on the selected number of cycles/samples multiplied by a fraction value. In another example, the threshold value is ¾ of the selected number of cycles. However, it is appreciated that other suitable fraction values can be utilized. The fraction value can be predetermined, based on prior calibrations, and the like.

Once a second PLL 106 is provided with a changed period/phase (i.e. the PLL integer/fractional or phase shift), the second PLL 106 adjusts the phase of the variable clock as short term change, in period in one example, of the second PLL 106 and results in change or adjustment of the phase of the variable clock.

The calibration circuit 110 waits for a pre-determined number cycles (YYYY) to have the PLL affect the output variable clock phase. It is appreciated that the calibration circuit 110 can re-perform the above to generate additional phase adjustments of the variable clock.

Once the phases of the reference clock and the variable clock are aligned, the variable clock rising edge is aligned with the reference clock rising edge. The compare flop 204 results in becoming metastable.

As meta-stability being unstable, the output of synchronizer flop 206 settles down to either 0 or 1, resulting in sign counter down or up counting.

As the comparison is done for the pre-determined or selected number of clock cycles/samples (XXXX), the comparator flop 204 output for samples and/or all samples does not settle down to fixed 0 or fixed 1 due to metastability.

For the sampled number of clocks (XXXX), this indeterminism will result in some comparisons settling to "0" and some to "1", resulting in the unsigned sign counter value not counting up to (being less than) XXXX by an amount.

As described above, when the sign counter unsigned value is less than or equal to ¾th (or other configurable fractional value) of clock cycles/samples (XXXX) the calibration will exit as clocks are aligned.

Figure 4:
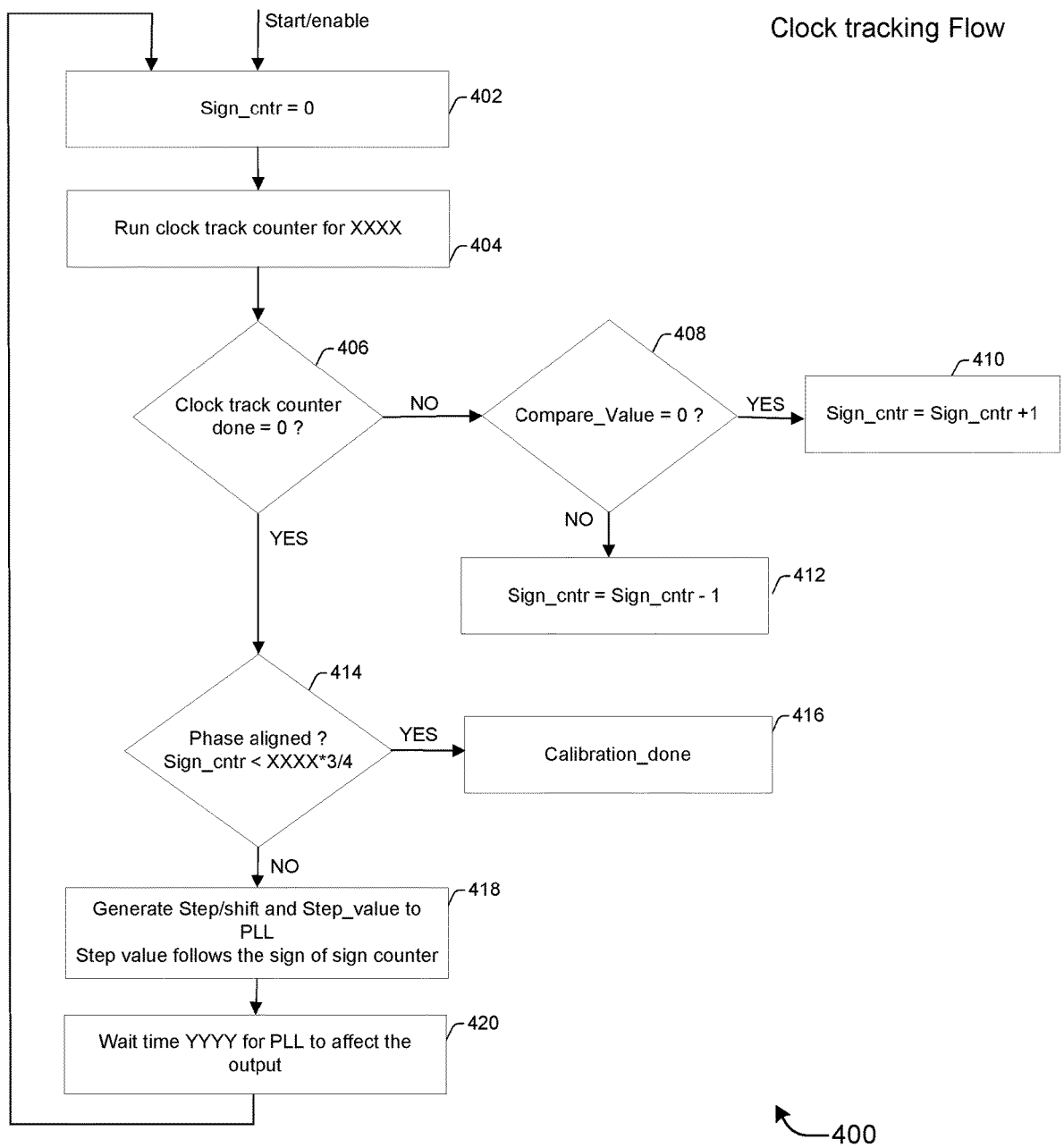
FIG. 4 is a flow diagram illustrating a method of performing phase alignment for a plurality of clocks in accordance with one or more embodiments.

FIG. 4 is a flow diagram illustrating a method 400 of performing phase alignment for a plurality of clocks in accordance with one or more embodiments. The method 400 is provided for illustrative purposes and it is appreciated that suitable variations are contemplated.

The method 400 is described with reference to the architecture 100 and 200 for illustrative purposes. It is appreciated that other suitable architectures can be used to perform the method 400. The method 400 operates on a reference clock and a variable clock. The variable clock has a dynamic frequency. Further the variable clock can have phase offset(s) with respect to the reference clock due to being generated by different PLLs, propagating along different circuit paths, and the like.

The method 400 begins at block 402, where a sign counter (Sign_cntr) is reset or set to zero (0). Thus, the sign counter 208 is set to zero.

A number of clock cycles of the reference clock to perform the phase calibration is set or configured at block 404. The number of cycles is shown as XXXX in the FIG. 4 for illustrative purposes. In one example, the number of clock cycles is set to 64. It is appreciated that other values for the number of cycles are contemplated.

The number of clock cycles used can be determined by previous phase alignment calibrations, processing time, and the like.

A check is performed at block 406 to determine if the number of cycles (XXXX) has been completed before moving to the block 414. In this example, the counter done value is initially set to the number of cycles (XXXX) and the counter done value is decremented for each cycle, for example, at blocks 410 or 412. If the counter done is not equal to zero, the method moves to block 408. If the counter done is equal to zero, the method moves to block 414.

At block 408, a check is made on whether the compare_value is equal to 0. A sample of the reference clock and a sample of the variable clock are compared to generate the compare value. In one example, the samples are at a rising edge of the reference clock.

The compare_value is the output of the synchronizer 206 of FIG. 2. If the compare_value is 0, the sign counter (Sign_cntr) is incremented at block 410 and the method returns to block 406 for another iteration at a next cycle of the reference clock. If the compare_value is not 0, the sign counter (Sign_cntr) is decremented at block 412 and the method returns to block 406 for another iteration at a next cycle of the reference clock. Additionally, the counter done is decremented before the next cycle is sampled.

A determination is made at block 414 as to whether the reference clock and the variable clock are phase aligned. The determination here is based on the sign counter (Sign_cntr). The determination is that the clocks are phase aligned if the sign counter (unsigned or magnitude) is less than a threshold value, such as the number of cycles (XXXX)*¾. It is appreciated that other suitable determination basis are contemplated.

If the sign counter is greater than the threshold value, it is determined that the phases of the variable clock and the reference clock are not aligned.

For the number of clock cycles (XXXX), such as 64, the sign counter value is incremented or decremented. The phase shift is determined if the phases are not aligned or calibration is exited if the phases of the variable clock and the reference clock are aligned. The phases are aligned, in one example, if the sign counter is less than the number of cycles (XXXX)*¾ and determines/generates a phase shift if the sign counter is greater than the number of cycles (XXXX)*¾.

If the reference clock and the variable clock are not phase aligned, the method 400 moves to block 418 where a step and step value (phase shift) for the variable clock are generated. The step value follows the sign of the sign counter.

The direction of the phase shift is based on the sign of the sign counter (positive or negative).

The method 400 waits for a period of time at block 420 for the step value to be implemented. The method 400 can be performed again at block 402 once the period of time has elapsed. Generally, the method 400 is performed one or more times until the phases are aligned and there is a calibration done decision made at block 414. However, it is appreciated that the method 400 can be performed a fixed number of times, in response to a signal, in response to a condition, in response to a changed frequency of the variable clock, and the like.

It is appreciated that suitable variations of the method 400 are contemplated.

Figure 5:
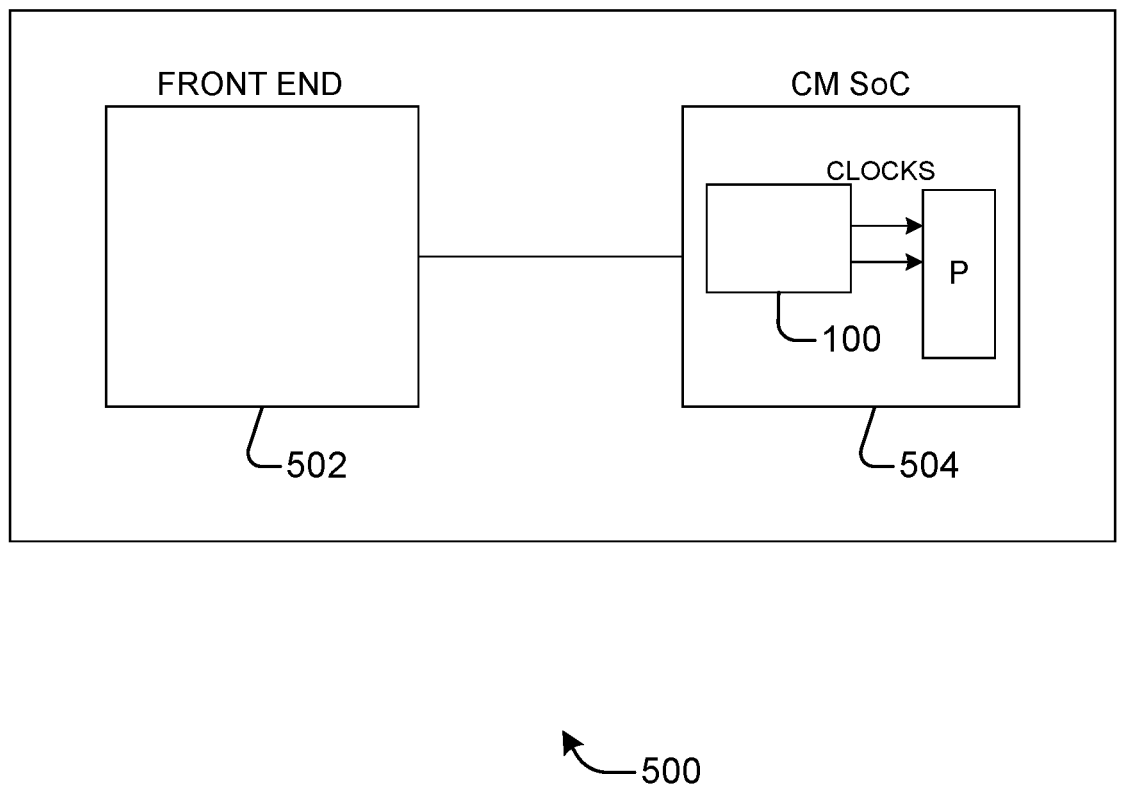
FIG. 5 is a diagram illustrating an example cable modem in accordance with some embodiments.

FIG. 5 is a diagram illustrating an example cable modem 500 in accordance with some embodiments. The cable modem 500 is provided for illustrative purposes and it is appreciated that suitable variations are contemplated.

The cable modem 500 includes a front end 502 and a silicon on chip (SoC) 504. The front end 502 and the SoC are connected via an interface.

The front end 502 is an analog front end and sends and receives signals via an infrastructure. The front end 502 includes a tuner and one or more receivers and transmitters that communicate over the infrastructure. The front end 502 can also utilize various filters, amplifiers and the like to process received and transmitted signals.

The infrastructure can include a coaxial cable, fiber, hybrid fiber coaxial, and the like. The front end 502 processes received signals and provides these signals to the SoC in digital form using the interface. The front end 502 also processes signals from the SoC for transmission via the infrastructure.

The SoC 504 can be compatible with cable modem specifications such as data over cable service interface specification (DOCSIS) versions 3.0, 3.1, 3.1 Full Duplex, and the like. The SoC 504 includes circuitry to perform modulation, demodulation, encoding, decoding, signal processing and the like. This circuitry can utilize clocks such as the reference clock and the variable clock described above.

Further, the SoC 504 includes a clock alignment architecture, such as the architecture 100 described above. The clock alignment architecture can be used to align and/or phase align various clocks used by the SoC 504. In one example, a plurality of phase locked loops (PLLs) generate the various clocks.

The SoC 504 includes a processor based circuit that includes a first partition that uses a first clock a fixed frequency and a second partition that utilizes a second clock having a second frequency. The second clock can utilize dynamic frequency scaling for its operation, where the second clock frequency can change dynamically. The first clock can be a reference clock and the second clock can be a variable clock, as described above. The architecture 100 is configured to phase align the first clock and the second clock.

Figure 6:
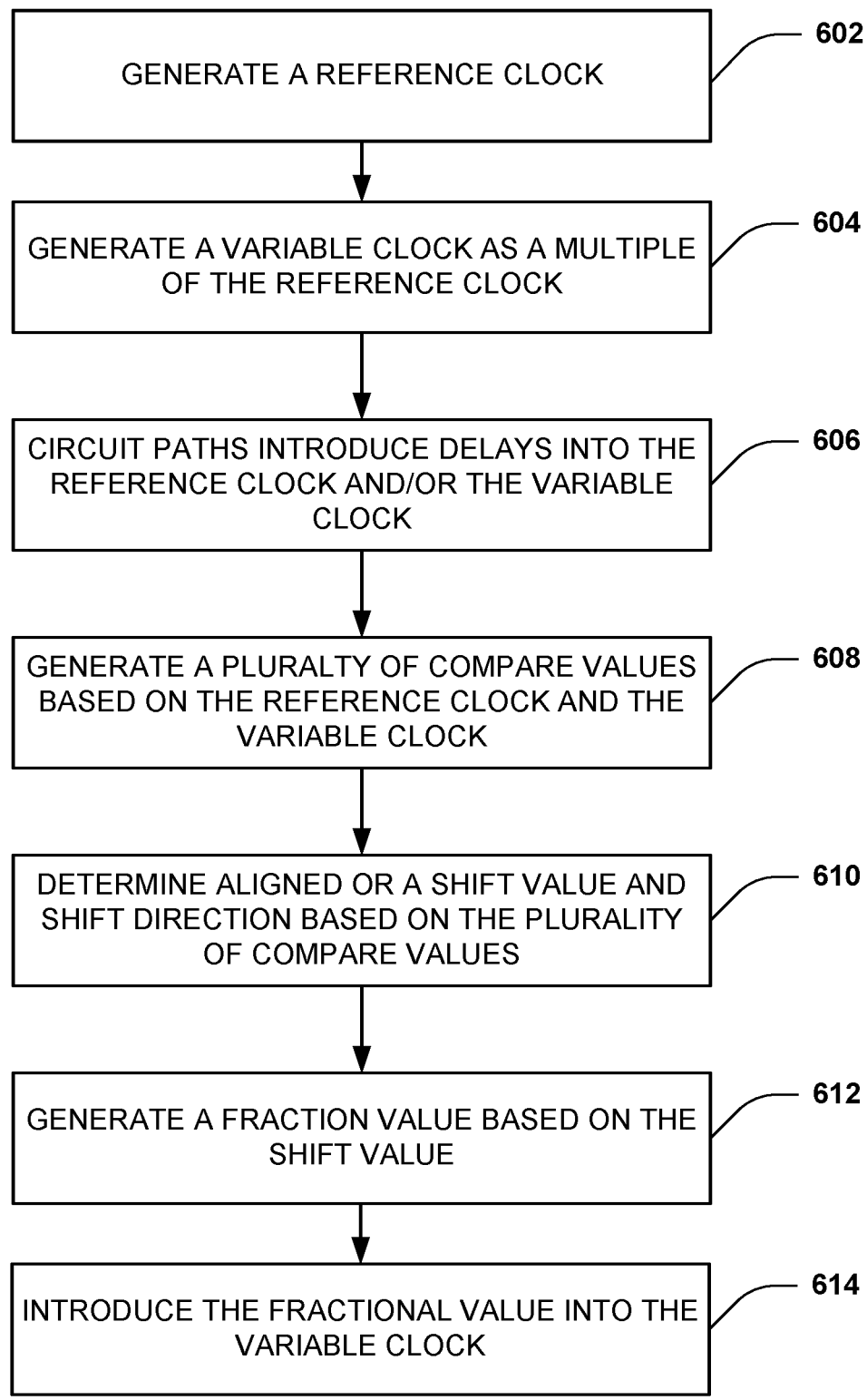
FIG. 6 is a flow diagram illustrating a method of phase aligning clocks in accordance with one or more embodiments.

FIG. 6 is a flow diagram illustrating a method 600 of phase aligning clocks in accordance with one or more embodiments. The method 600 is provided for illustrative purposes and it is appreciated that suitable variations are contemplated.

The architecture 100 and the calibration circuit 110 can be referenced to further illustrate operation of the method 600. Further, the method 600 can be implemented using the architecture 100, the calibration circuit 110, and the like.

The method begins at block 602 where a first phase locked loop (PLL) generates a reference clock using a crystal oscillator. An example of the first PLL is shown in FIG. 1 as the PLL0 104.

A second PLL generates a variable clock based on the reference clock at block 604. The second PLL typically introduces a phase offset into the variable clock because it is a different circuit and can have some inherent variations. These variations can impact the phase of the variable clock. An example of the second PLL is shown in FIG. 1 as the PLL1 106.

A first path introduces cell/wire delays into the reference clock and a second path introduces cell/wire delays into the variable clock at block 606. The introduced delays can add additional phase offset of the variable clock with respect to the reference clock and are additional or cumulative with the phase offset induced by the second PLL.

A compare circuit, such as the flop 204 and the synchronizer 206, compares the variable clock with edges of the reference clock for a number of cycles of the reference clock at block 608 to generate a plurality of compare values. In one example, the number of cycles is pre-determined. The compare values can be used, in one example, to increment or decrement a sign counter.

A decision circuit determines a shift value and a shift direction at block 610 based on the plurality of compare values if the variable clock and the reference clock are not phase aligned. The decision circuit can also determine that the phases of the variable clock and the reference clock are aligned and that calibration is done and/or completed at block 610.

In one example, the decision circuit 210 obtains a sign counter value based on the plurality of compare values. The sign counter is incremented or decrement each cycle based on a compare value for that cycle. The decision circuit 210 can determine that the variable clock and the reference clock are phase aligned if the sign counter magnitude or unsigned value is less than a threshold amount. In one example, the threshold amount is the number of cycles multiplied by a fraction value (e.g., ¾).

A phase shifter circuit updates second PLL fractional/integer value based on the shift value and the shift direction for one PLL reference clock at block 612. If the calibration is done, shift value and shift direction is not typically generated at block 610. Additionally, if the calibration is done, the phase shifter circuit can be disabled and does not generate the fractional value.

The fractional value or phase shift is introduced into the variable clock to adjust or shift the phase of the variable clock with respect to the reference clock by the second PLL at block 614.

The method 600 can be repeated until the phases are aligned and the calibration is done. Once the calibration is done, the method 600 can be exited. The method 600 can be repeated and/or initiated based on a frequency change of the variable clock, a signal, an operating condition, and the like.

Additionally, it is appreciated that suitable variations in the method 600 are contemplated.

As utilized above and herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor shared, )dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a phase alignment system for aligning clocks. The system includes a calibration circuit and a phase locked loop (PLL). The calibration circuit is configured to receive a variable clock and a reference clock; compare one or more phases of the variable clock and the reference clock to generate one or more comparisons using metastability, and generate a phase shift upon based on the one or more comparisons. The PLL is configured to generate the variable clock and incorporate the phase shift generated by the calibration circuit.

Example 2 includes the subject matter of Example 1, including or omitting optional elements, wherein the PLL dynamically generates the variable clock at a selected multiple of the reference clock.

Example 3 includes the subject matter of any of Examples 1-2, including or omitting optional elements, wherein the calibration circuit includes a comparison flip flop that enters a metastable state upon the variable clock and the reference clock being phase aligned.

Example 4 includes the subject matter of any of Examples 1-3, including or omitting optional elements, wherein the PLL induces a phase offset with regard to the reference clock into the variable clock after a selected number of cycles of the reference clock.

Example 5 includes the subject matter of any of Examples 1-4, including or omitting optional elements, wherein the system includes a path for the reference clock that includes wire delays that impact a phase of the reference clock.

Example 6 includes the subject matter of any of Examples 1-5, including or omitting optional elements, further comprising a second PLL configured to generate the reference clock.

Example 7 includes the subject matter of any of Examples 1-6, including or omitting optional elements, wherein the calibration circuit is configured to determine phase alignment and/or phase misalignment based on the one or more comparisons.

Example 8 includes the subject matter of any of Examples 1-7, including or omitting optional elements, further comprising a phase shifter that generates a fractional value based on the phase shift.

Example 9 is a calibration circuit for phase aligning clocks. The calibration circuit includes a compare flop, a synchronizer flop, a sign counter, and a decision circuit. The compare flop is configured to generate a compare output based on a variable clock and a reference clock. The synchronizer flop is configured to generate a compare value based on the compare flop output and the reference clock. The sign counter circuit is configured to increment or decrement a sign counter based on the compare value. The decision circuit configured to generate a shift value based on the sign counter.

Example 10 includes the subject matter of Example 9, including or omitting optional elements, further comprising a clock track counter circuit configured to count cycles of the reference clock.

Example 11 includes the subject matter of any of Examples 9-10, including or omitting optional elements, wherein the clock track counter circuit is configured to generate a clock track enable signal based on the counted cycles of the reference clock.

Example 12 includes the subject matter of any of Examples 9-11, including or omitting optional elements, wherein the clock track enable signal enables or disables the synchronizer flop and the sign counter circuit.

Example 13 includes the subject matter of any of Examples 9-12, including or omitting optional elements, wherein the clock track counter circuit counts down from a predetermined value.

Example 14 includes the subject matter of any of Examples 9-13, including or omitting optional elements, wherein the decision circuit is configured to generate a shift direction based on the sign counter.

Example 15 includes the subject matter of any of Examples 9-14, including or omitting optional elements, wherein a phase of the variable clock is shifted based on the shift value.

Example 16 includes the subject matter of any of Examples 9-15, including or omitting optional elements, wherein the compare output is indeterminate if phases of the variable clock and the reference clock are aligned.

Example 17 is a method of aligning clocks. The method includes comparing phases of a variable clock and a reference clock with a compare flip flop for a number of cycles of the reference clock to generate a plurality of compare values; generating a shift value based on the plurality of compare values; and generating a shift direction based on the plurality of compare values.

Example 18 includes the subject matter of Example 17, including or omitting optional elements, further comprising generating the variable clock as a multiple of the reference clock by a phase locked loop (PLL).

Example 19 includes the subject matter of any of Examples 17-18, including or omitting optional elements, further comprising generating a fractional phase adjustment based on the shift value, the shift direction and the number of cycles.

Example 20 includes the subject matter of any of Examples 17-19, including or omitting optional elements, further comprising generating the reference clock with a first phase locked loop (PLL) and generating the variable clock with a second phase locked loop (PLL), wherein the second PLL introduces phase offsets into the variable clock.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). The techniques can also be used with new radio (NR) 5G, also from the 3GPP organization. Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Techniques described herein can be used for various cable modem systems and standards. These standards include, but are not limited to, data over cable service interface specification (DOCSIS) versions 3.0, 3.1 and 3.1 Full Duplex.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A phase alignment system for aligning clocks, the system comprising:
    a phase locked loop (PLL) configured to generate an output comprising a variable clock at a variable clock frequency; and
    a calibration circuit configured to:
        receive the variable clock at the variable clock frequency and a reference clock;
        compare, via a comparison flip flop, one or more phases of the variable clock at the variable clock frequency and the reference clock to generate one or more comparisons;
        make a determination whether the comparison flip flop is in a metastable state based on the one or more comparisons; and
        generate a phase shift value based on the one or more comparisons, wherein, in response to the determination that the comparison flip flop is in the metastable state, the phase shift value is zero;
        wherein the PLL is further configured to adjust a phase of the variable clock based on the generated phase shift value.

2. The system of claim 1, wherein the PLL dynamically generates the variable clock at a selected multiple of the reference clock.

3. The system of claim 1, wherein the comparison flip flop enters a metastable state upon the variable clock and the reference clock being phase aligned.

4. The system of claim 1, wherein the PLL induces a phase offset with regard to the reference clock into the variable clock after a selected number of cycles of the reference clock.

5. The system of claim 1, wherein the system includes a path for the reference clock that includes wire delays that impact a phase of the reference clock.

6. The system of claim 1, further comprising another PLL configured to generate the PLL clock.

7. The system of claim 1, wherein the calibration circuit is configured to determine phase alignment and/or phase misalignment based on the one or more comparisons.

8. The system of claim 1, further comprising a phase shifter that generates an updated fractional/integer value for the PLL based on the phase shift value, in order to enable the PLL to adjust the phase of the variable clock.

9. A method of aligning clocks, the method comprising:
receiving, at a comparator flip-flop, a variable clock at a variable clock frequency from a phase locked loop (PLL), wherein the variable clock comprises an output of the PLL, and;
comparing phases of the variable clock at the variable clock frequency and a reference clock with the comparator flip-flop for a plurality of cycles of the reference clock to generate a plurality of compare values;
determining, based on the plurality of compare values, whether the comparator flip-flop is in a metastable state;
in response to a determination that the comparator flip-flop is in a metastable state, leaving the phase of the variable clock unadjusted; and
in response to a determination that the comparator flip-flop is not in a metastable state:
  generating a shift value based on the plurality of compare values; and
  generating a shift direction based on the plurality of compare values.

10. The method of claim 9, wherein the variable clock is generated as a multiple of the reference clock.

11. The method of claim 9, further comprising generating an updated fractional/integer value for the PLL, based on the shift value, the shift direction and the number of cycles.

12. The method of claim 9, wherein the PLL introduces phase offsets into the variable clock with respect to the reference clock.

* * * * *